United States Patent
Tanokuchi et al.

(10) Patent No.: US 9,968,019 B2
(45) Date of Patent: May 8, 2018

(54) COMPONENT FEEDING DEVICE, AND COMPONENT MOUNTING DEVICE

(71) Applicant: YAMAHA HATSUDOKI KABUSHIKI KAISHA, Iwata-shi, Shizuoka-ken (JP)

(72) Inventors: Akito Tanokuchi, Tokyo (JP); Tsutomu Yanagida, Kumagaya (JP); Kazuyoshi Ohyama, Kumagaya (JP); Yoshinori Kano, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 227 days.

(21) Appl. No.: 14/893,733

(22) PCT Filed: May 22, 2014

(86) PCT No.: PCT/JP2014/063621
§ 371 (c)(1),
(2) Date: Nov. 24, 2015

(87) PCT Pub. No.: WO2014/192639
PCT Pub. Date: Dec. 4, 2014

(65) Prior Publication Data
US 2016/0128245 A1    May 5, 2016

(30) Foreign Application Priority Data

May 31, 2013    (JP) .................................. 2013-114805

(51) Int. Cl.
*H05K 13/02* (2006.01)
*B65H 5/28* (2006.01)
(Continued)

(52) U.S. Cl.
CPC ............... *H05K 13/02* (2013.01); *B65H 5/28* (2013.01); *B65H 20/20* (2013.01); *H05K 13/021* (2013.01);
(Continued)

(58) Field of Classification Search
CPC .... H05K 13/02; H05K 13/022; H05K 13/021; H05K 13/0417; B65H 5/28; B65H 20/20
See application file for complete search history.

(56) References Cited

U.S. PATENT DOCUMENTS 5,725,140 A * 3/1998 Weber .................. B65H 37/002
                                                     226/128
6,032,845 A * 3/2000 Piccone ................ B65H 20/22
                                                     198/832.1

(Continued)

FOREIGN PATENT DOCUMENTS

CN          1578616 A    2/2005
DE     102009004753 B3    9/2010
(Continued)

OTHER PUBLICATIONS

The First Office Action issued by the State Intellectual Property Office of People's Republic of China dated Apr. 27, 2017, which corresponds to Chinese Patent Application No. 201480030743.1 and is related to U.S. Appl. No. 14/893,733; with English language translation.

(Continued)

*Primary Examiner* — Carl Arbes
(74) *Attorney, Agent, or Firm* — Studebaker & Brackett PC

(57) ABSTRACT

A component feeding device transports a tape (a component feeding tape) in which electronic components are stored with some transportation device, and exposes the components. Transportation of the component feeding tape may be (Continued)

performed by fitting a sprocket with a feed hole of the component feeding tape. It has been found that sprocket does not necessarily fit with the feed hole of the component feeding tape. It has been found that this phenomenon takes place in a case of driving at least two or more sprockets with a driving device. When the sprocket does not fit with the feed hole, transportation of the tape is not correctly performed, but exerts an undesirable influence such as reduction of mounting efficiency on feeding of the components and subsequent mounting of the components. One feature resides in rendering a backlash of an upstream-side sprocket larger than a backlash of a downstream-side sprocket.

32 Claims, 7 Drawing Sheets

(51) Int. Cl.
   *B65H 20/20* (2006.01)
   *H05K 13/04* (2006.01)
(52) U.S. Cl.
   CPC ....... *H05K 13/0417* (2013.01); *H05K 13/022* (2013.01)
(56) References Cited

U.S. PATENT DOCUMENTS

| | | | | |
|---|---|---|---|---|
| 6,269,860 B1 * | 8/2001 | Ishikawa | ............ | H05K 13/0417 156/701 |
| 6,318,437 B1 * | 11/2001 | Yoo | ............ | H05K 13/021 156/701 |
| 7,073,696 B2 * | 7/2006 | College | ............ | H05K 13/0417 226/139 |
| 7,220,095 B2 * | 5/2007 | Lyndaker | ............ | H05K 13/0417 414/810 |
| 7,472,737 B1 * | 1/2009 | Rachkov | ............ | G03B 1/24 156/539 |
| 7,866,518 B2 * | 1/2011 | Wada | ............ | B65H 20/20 226/128 |
| 2005/0011926 A1 | 1/2005 | Yanagida | | |

FOREIGN PATENT DOCUMENTS

| | | |
|---|---|---|
| EP | 1494522 A2 | 1/2005 |
| JP | H04-177892 A | 6/1992 |
| JP | H10-139272 A | 5/1998 |
| JP | 2010-199567 A | 9/2010 |
| JP | 2011-181816 A | 9/2011 |
| JP | 2012-134218 A | 7/2012 |
| JP | 2013-055116 A | 3/2013 |
| JP | 2014011328 A * | 1/2015 |

OTHER PUBLICATIONS

The extended European search report issued by the European Patent Office dated Jun. 1, 2016, which corresponds to European Patent Application No. 14803397.0-1803 and is related to U.S. Appl. No. 14/893,733.

International Search Report issued in Application No. PCT/JP2014/063621, dated Aug. 26, 2014.

* cited by examiner

FIG.3
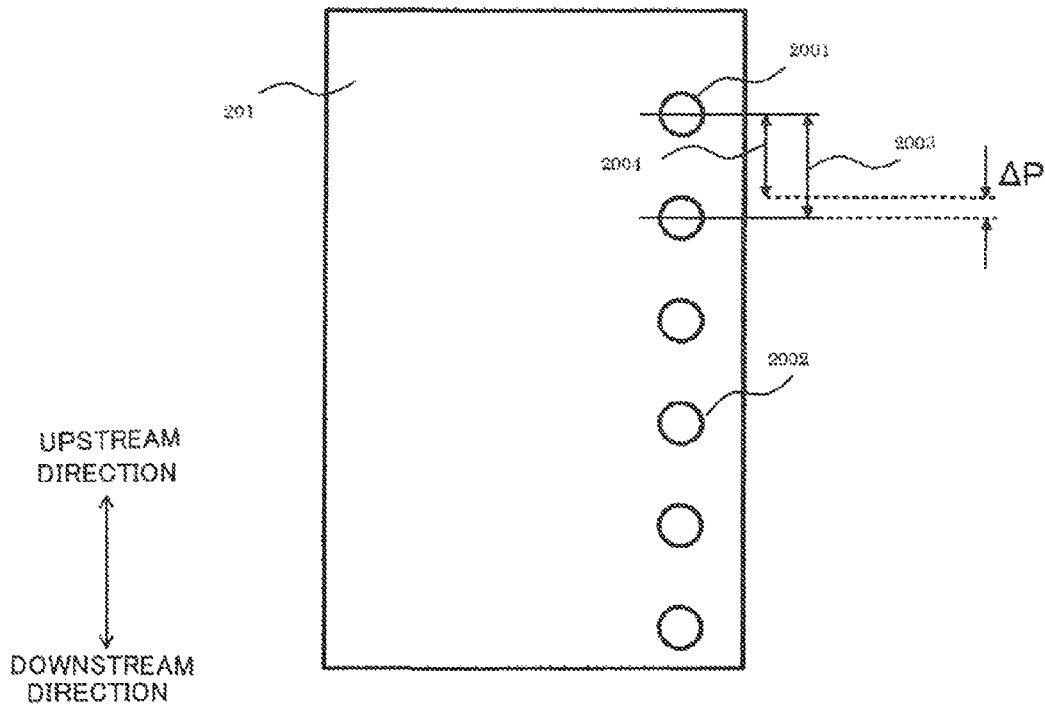
UPSTREAM
DIRECTION
DOWNSTREAM
DIRECTION
FIG.4
| ACCUMULATED PITCH ERROR | SPROCKET 252 | SPROCKET 251 |
|---|---|---|
| NONE, OR SMALL | 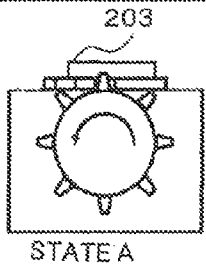 STATE A | 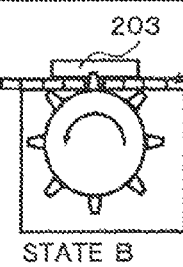 STATE B |
| LARGE | 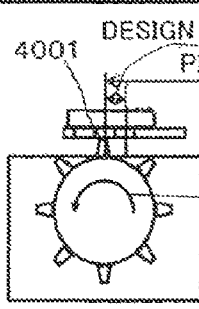 STATE C | 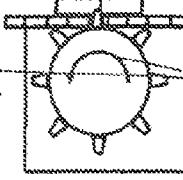 STATE D |

COMPONENT FEEDING DEVICE, AND COMPONENT MOUNTING DEVICE

CROSS REFERENCE TO RELATED APPLICATIONS

This application claims benefit of priority to Japanese Patent Application 2013-114805 filed May 31, 2013, and to International Patent Application No. PCT/JP2014/063621 filed May 22, 2014, the entire content of which is incorporated herein by reference.

TECHNICAL FIELD

The present disclosure relates to a component feeding device, and a component mounting device employing the same. For example, the present disclosure relates to a component feeding device transporting a tape storing electronic components and exposing the electronic components, and a component mounting device adsorbing and holding the exposed electronic components and mounting the same on substrates.

BACKGROUND

A component mounting device is used for manufacturing various electrical apparatuses. The component mounting device mainly adsorbs and holds electronic components, and loads the electronic components on substrates. It is a component feeding device that feeds the electronic components to this component mounting device.

SUMMARY

Problem to be Solved by the Disclosure

A component feeding device transports a tape (a component feeding tape) in which electronic components are stored by some transportation device, and exposes the components. Transportation of the component feeding tape may be performed by fitting sprockets with feed holes of the component feeding tape. In the present disclosure, it has been found that the sprockets do not necessarily fit with the feed holes of the component feeding tape. More specifically, it has been found that this phenomenon takes place in a case of driving at least two or more sprockets with a driving device exemplified by a motor. When the sprockets do not fit with the feed holes, transportation of the tape is not correctly performed, but exerts an undesirable influence such as lowering of mounting efficiency, for example, on feeding of the components and subsequent mounting of the components. Consideration regarding this point is not sufficient in the prior art.

Solving the Problem

One feature of the present disclosure resides in rendering a backlash of an upstream-side sprocket larger than a backlash of a downstream-side sprocket.

Effect of the Disclosure

According to the present disclosure, a component feeding tape can be correctly transported.

BRIEF DESCRIPTION OF THE DRAWINGS

FIG. 3 is a diagram illustrating the component feeding tape 201 from above.

FIG. 4 is a diagram illustrating a subject of this Embodiment.

MODES FOR CARRYING OUT THE DISCLOSURE

Detailed Description

Modes of Embodiments of the present disclosure are now described.

Embodiment 1

Figure 1:
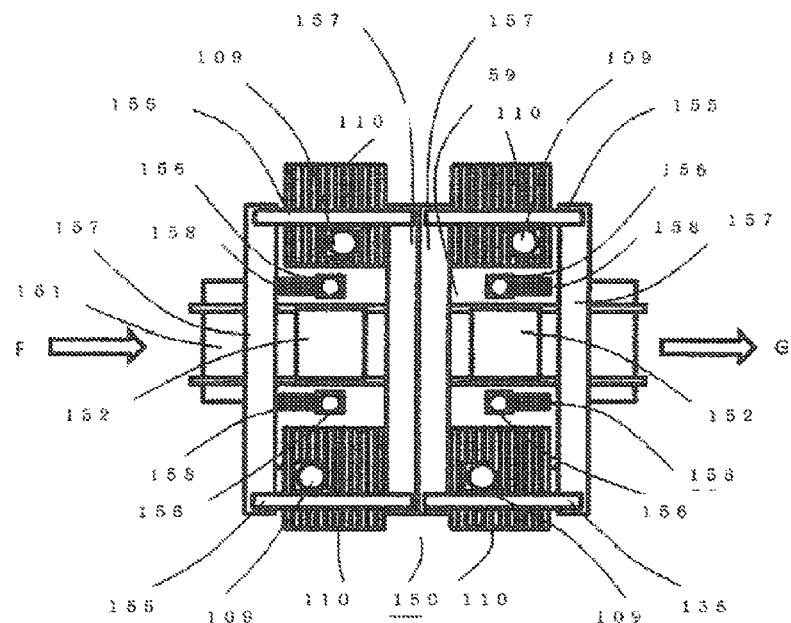
FIG. 1 is a diagram illustrating a component mounting device.

FIG. 1 is a diagram illustrating a component mounting device according to this Embodiment. Component feeding devices 110 are plurally fixed onto a base 59 of a component mounting device 150 to be attachable/detachable.

The component feeding devices 110, also referred to as feeders, are devices enabling a component adsorbing/mounting device 109 of the component mounting device 150 to adsorb electronic components by being loaded with component feeding tapes, exposing the electronic components stored in the component feeding tapes and preparing the same on component extraction holes.

Exposure of the electronic components is performed by electronic component exposing devices loaded on the component feeding devices 110. The component extraction holes are one of the components of the electronic component exposing devices. Various electronic components can be fed to the component mounting device by loading component feeding tapes storing different electronic components on the plurality of component feeding devices 110.

A substrate transportation conveyor 151 is provided on a space through which the component feeding devices 110 are opposed to each other. The substrate transportation conveyors 151 locates substrates 152 transported from a direction of arrow F on prescribed positions, and transports the same in a direction of arrow G after the electronic components are mounted on the substrates 152.

X-beams 155 are a pair of beams long in the same direction as the direction where the substrates 152 are transported, and unshown actuators (linear motors or the like, for example) are mounted on both end portions thereof.

The X-beams 155 are supported by these actuators to be movable along Y-beams 157 in a direction orthogonal to the direction where the substrates 152 are transported, and capable of coming and going between the component feeding devices 110 and the substrates 152.

Further, component adsorbing/mounting devices 109 moving along the X-beams are set on the X-beams 155 in the longitudinal direction of the X-beams 155 by the unshown actuators (linear motors or the like, for example).

Recognition cameras 156 and nozzle holding portions 158 are arranged between the component feeding devices 110 and the substrate transportation conveyor 151. The recognition cameras 156 are those for acquiring misregistration information of the electronic components adsorbed by the component adsorbing/mounting devices 109 from the component extraction holes of the component feeding devices 110, and capable of confirming how much the electronic components misregister in the transportation direction for the substrates 152 and the direction orthogonal to the substrate transportation direction and to what degrees rotation angles are by photographing electronic components. Needless to say, it is also possible to confirm whether or not the electronic components are adsorbed by photographing the same. The X-beams 155 and the Y-beams 157 so operate in parallel that the component adsorbing/mounting devices 109 are made to pass over the recognition cameras 156 when moving from the component feeding devices 110 onto the substrates 152, to acquire the aforementioned misregistration information of the electronic components. The nozzle holding portions 158 are places holding a plurality of unshown adsorption nozzles, mounted on the component adsorbing/mounting devices 109, necessary for adsorbing and mounting various electronic components. When instructed to mount adsorption nozzles corresponding to the electronic components, the component adsorbing/mounting devices 109 are made to move up to the nozzle holding portions 158 due to parallel operations of the X-beams 155 and the Y-beams 157, to exchange the adsorption nozzles.

The component feeding devices 110 are set to partially face the periphery of the component mounting device 150, so that an operator mounts the same on the base 59 from the periphery of the component mounting device 150. On the other hand, the component extraction holes of the component feeding devices 110 are structured to be in the vicinity of the substrates 152, i.e., on the inner side (not on the periphery side) of the component mounting device when mounted on the base 59, so that the distance of movement of the component mounting device 150 may be small, in order to reduce the time required for the mounting.

Figure 2:
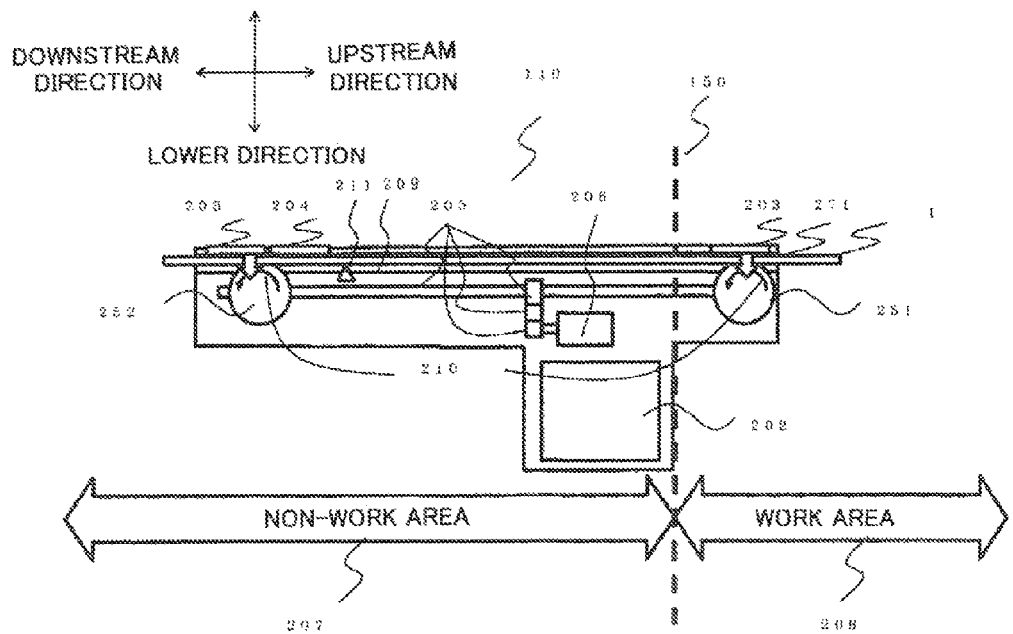
FIG. 2 is a sectional view of a component feeding device 110 in Embodiment 1 and a component feeding tape 201.

The component feeding device and the component feeding tape are described with reference to FIGS. 2 and 3. FIG. 2 is a sectional view of the component feeding device 110 according to this Embodiment and the component feeding tape 201, and FIG. 3 is a diagram illustrating the component feeding tape from above.

First, description of the structure of the component feeding tape 201 is performed. The component feeding tape 201 is constituted of a carrier tape storing electronic components and a cover tape. The cover tape is stuck on the carrier tape in order to seal the electronic components. Feed holes for fitting with sprockets and pockets storing the electronic components are continuously provided on the carrier tape to be at constant intervals respectively, and the cover tape carries out a role of covering the electronic components so that the electronic components do not slip out of the pockets. Fitting can also be expressed as fitting, for example. As to the feed holes of the component feeding tape 201, the design value of the distance between two adjacent feed holes is about 1 to 4 mm, and there is such a tendency that a molding error (the difference between the design value and the actual value) between two feed holes having several feed holes therebetween is larger than a molding error (the difference between the design value and the actual value) between two adjacent feed holes.

In the following, the interval between feed holes is expressed as a pitch, the difference between the design value of the pitch as to adjacent feed holes and the actual value of the pitch as to the adjacent feed holes is referred to as a pitch error, and the difference between the design value of the pitch as to two separate feed holes and the actual value of the pitch as to the two separate feed holes is referred to as an accumulated pitch error. As to the pitch error and the accumulated pitch error, standards are set according to JIS respectively. The component feeding tape 201 is delivered from the maker of the electronic components in a state wound on a storage tape reel.

The pitch is expressed as a sign 2003 in FIG. 3, and the two separate feed holes can be expressed as two feed holes being in a relation including at least one or more feed holes therebetween, as a sign 2001 and a sign 2002. When expressing the design value of the pitch as to the adjacent feed holes as a sign 2004, further, the pitch error is expressed as ΔP. When the design value of the pitch as to the adjacent feed holes is 2 mm and the actual value of the pitch as to the adjacent feed holes is 2.1 mm, for example, the pitch error ΔP can be expressed as 0.1 mm.

While the subject of this Embodiment is now described with reference to FIG. 4, the following description is that for illustrating the same to be easily understandable for those skilled in the art, and not intended to unnecessarily restrict the present disclosure.

The component feeding device 110 has a total length of several 100 mm, and the distance between two sprockets positioned substantially on both ends of the component feeding device 110 is also several 100 mm. When adjusting the distance between sprockets 251 and 252 so that the sprocket 251 and the sprocket 252 both fit with feed holes and adjusting the rotation angles of the sprockets 251 and 252 to be the design value of the distance between the feed holes of the component feeding tape 201, the sprocket 251 and the sprocket 252 can both fit with feed holes (a state A and a state B in FIG. 4) in a case where no accumulated pitch error is present or the accumulated pitch error is small. When rotating the sprocket 251 and the sprocket 252 substantially at the same speed in a case where the accumulated pitch error is large, however, such an inconvenience takes place that the sprocket 252 does not fit with any feed hole as shown by a sign 4001 (a state C in FIG. 4).

A non-fitting state where the sprocket 252 does not fit with any feed hole is the subject to be solved, since this causes defective transportation of the component feeding tape 201 and leads to stoppage of electronic component feeding to the component mounting device 150. While there is a method of adjusting the distance between the sprockets and the mounting angle of the sprockets in response to the accumulated pitch error as a solving method, the accumulated pitch error is dispersed depending on the type of the component feeding tape, and hence there is undesirably a need for performing complicated adjustment of every component feeding tape. While it is also possible to automatically adjust the rotation angles of the sprockets in response to the quantity of the accumulated pitch error by driving the respective sprockets with different motors, this is undesirable in view of the cost. This Embodiment does not exclude the aforementioned adjustment per component feeding tape and the method of automatically adjusting the rotation angles of the sprockets in response to the quantity of the accumulated pitch error.

A way for solving the aforementioned subject is this Embodiment, which makes such setting that a backlash of the sprocket 251 (expressible as a first sprocket, for example) is larger than a backlash of the sprocket 252 (expressible as a second sprocket, for example) downstream beyond the sprocket 251. Then, a motor 206 is reversely rotated in a state where the component feeding tape 201 is transported and the forward end portion thereof reaches the sprocket 252. Thus, non-fitting can be suppressed as to the component feeding tape 201 having whatever accumulated pitch error while suppressing the number of used motors. The backlash can also be expressed as a clearance or a gap.

While the component feeding device according to this Embodiment is described in detail with reference to FIG. 2, the present disclosure is not restricted to the structure of the component feeding device according to this Embodiment. A component feeding device having a structure unproblematic for attaining functions/effects of this Embodiment can be expressed as being within the range of the disclosure of this specification.

A transportation path 209 deciding the direction where the component feeding tape 201 is transported is formed on the component feeding device 110. The component feeding device 110 further has the sprocket 251 and the sprocket 252 arranged along the transportation path 209. The sprocket 251 is arranged on an upstream side, and the sprocket 252 is arranged on a downstream side. The upstream side can also be expressed as a place closer to a component feeding tape insertion position 271 than the downstream side, and the downstream side can also be expressed as a position closer to the component extraction hole than the upstream side.

The backlash of the sprocket 251 is structured to be larger than the backlash of the sprocket 252. The component feeding device 110 has tape pressurizers 203 pressing the component feeding tape 201 present on the transportation path 209 against the sprocket 251 and the sprocket 252.

An electronic component exposing mechanism 204 (details are described later) for exposing the electronic components stored in the component feeding tape 201 is arranged between the sprocket 251 and the sprocket 252.

The component feeding device 110 has the motor 206 driving the sprocket 251 and the sprocket 252 and capable of controlling the rotation angles, a link mechanism 205 transmitting power of the motor 206 to the sprocket 251 and the sprocket 252, a processing substrate 202 performing control such as motor driving and a detection sensor 211 detecting the forward end of the component feeding tape 201. The motor 206 is an example of a driving portion, and the sprockets 251 and 252 may rotate substantially at the same speed through the motor 206. The detection sensor 211 is a photosensor, for example, and the detection sensor 211 is arranged to be present between the electronic component exposing mechanism 204 and the sprocket 251 in a case of observing the component feeding device 110 from an upper direction.

In a state where the component feeding device 110 is mounted on the base 59 in FIG. 1 by the operator, the sprocket 251 is positioned in a work area 208 facing the periphery of the component mounting device 150. On the other hand, the sprocket 252 is provided in the vicinity of the component extraction hole, and positioned in the vicinity of the substrate 152, i.e., on the inner side of the component mounting device 150 in a state mounted on the base 59.

The component feeding tape 201 is mounted on the sprocket 251 by the operator or with some mounting mechanism. The component feeding tape 201 is transported toward the sprocket 252 by the sprocket 251, thereafter fitted with the sprocket 252 while the stored electronic components are exposed by the electronic component exposing mechanism 204, and finally discharged out of the component feeding device 110.

The role of the sprocket 251 is to carry the component feeding tape mounted in the work area toward the sprocket 252 which is a non-work area 207. The role of the sprocket 252 is to precisely position the component feeding tape 201 by fitting with the feed holes of the component feeding tape 201 itself. The sprocket 252 can more precisely position the electronic components with respect to the component extraction hole by being present in the vicinity of the component extraction hole than a case of positioning the same at a distant position.

The work area 208 can be expressed as an area where the operator can perform some operation with respect to the component feeding device 110, and the non-work area 207 can be expressed as an area where the operator cannot substantially perform any operation with respect to the component feeding device 110 while the component feeding device 110 is present in the component mounting device 150. As shown in FIG. 2, the sprocket 251, the tape pressurizer 203 for the sprocket 251 and part of the link mechanism 205 are present in the work area 208, while the remaining structures are present in the non-work area 207.

While the respective ones of the sprocket 251 and the sprocket 252 can be driven with individual motors 206, the motors 206 are generally high-priced, and hence it is desirable to attain cost reduction by driving the sprockets 251 and 252 with the same motor 206 through the link mechanism 205. However, this Embodiment does not exclude use of a plurality of motors 206. In a case of driving the sprockets 251 and 252 substantially with the same motor through the link mechanism 205, rotational speeds 210 of the sprockets are desirably substantially identical rotational speeds, so that no useless force generates in the component feeding tape 201.

Figure 5A:
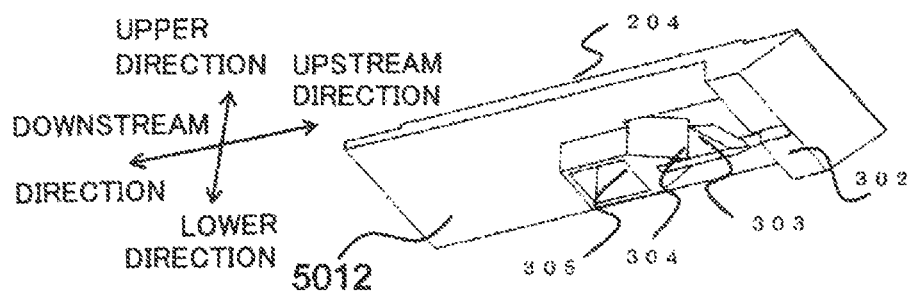
FIG. 5A is a diagram illustrating the whole of an electronic component exposing mechanism.
Figure 5B:
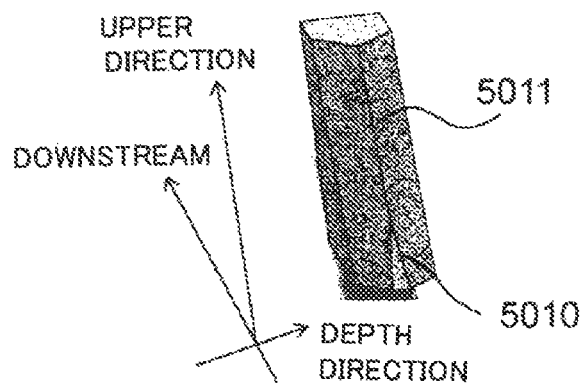
FIG. 5B is a diagram illustrating the details of a cutter of the electronic component exposing mechanism.
Figure 5C:
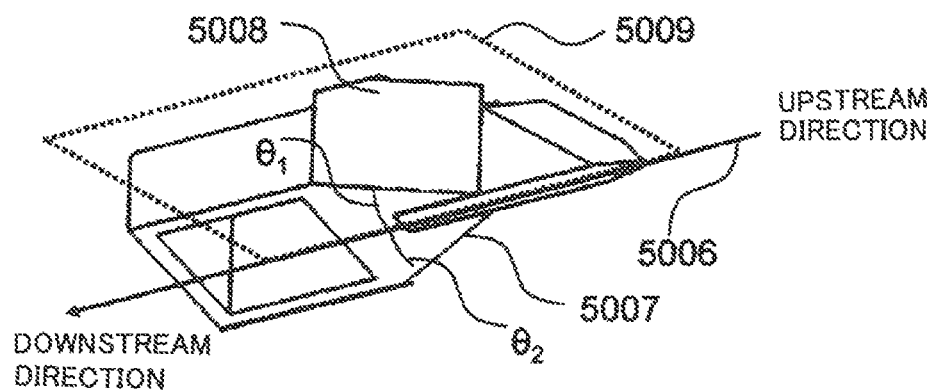
FIG. 5C is a diagram illustrating the details of a Russell portion of the electronic component exposing mechanism.

The details of the electronic component exposing mechanism 204 are now described with reference to FIGS. 5A to 5B. FIG. 5A is a diagram illustrating the whole of the electronic component exposing mechanism 204, FIG. 5B is a diagram illustrating details of a cutter 303, and FIG. 5C is a diagram illustrating details of a Russell portion 304.

As shown in FIG. 5A, the electronic component exposing mechanism 204 has the cutter 303, the Russell portion 304, a component extraction hole 305, a positioning guide 302 and a frame 5012 connecting these.

The positioning guide 302 is for pressing the component feeding tape 201. The cutter 303 has an inclined surface 5010 and a blade 5011 as shown in FIG. 5B.

The inclined surface 5010 is a surface inclined with respect to a plane substantially parallel to the component feeding tape 201, and is formed by chamfering part of the blade 5011. The shape of the inclined surface 5010 is triangular. Such an effect is attained by having the inclined surface 5010 that cuts the cover tape, described later, is not interrupted in a case where bending has taken place in the component feeding tape. The component feeding tape 201 is guided to the blade 5011 through the inclined surface 5010, and cut by the blade 5011.

The Russell portion 304 is an opening for spreading out the cut cover tape. The Russell portion 304 has surfaces 5007 and 5008 opening by angles $\theta 1$ and $\theta 2$ with respect to a plane 5009, passing through a line 5006 directed from the upstream side toward the downstream side, substantially parallel to the cutter 303, as shown in FIG. 5C. θ1 and θ2 may be substantially identical to each other, or may be different from each other. At least one of the surface 5007 and the surface 5008 may be bent. The cut cover tape is spread out by the surfaces 5007 and 5008. The components stored in the component feeding tape 201 are exposed due to the cutting with the cutter 303 and spreading of the cut portion with the Russell portion 304.

The component extraction hole 305 is that for extracting the exposed components, and passes through the frame 5012. This structure can also be so expressed that the frame 5012 is constituted not to inhibit extraction of the components, for example.

Figure 6:
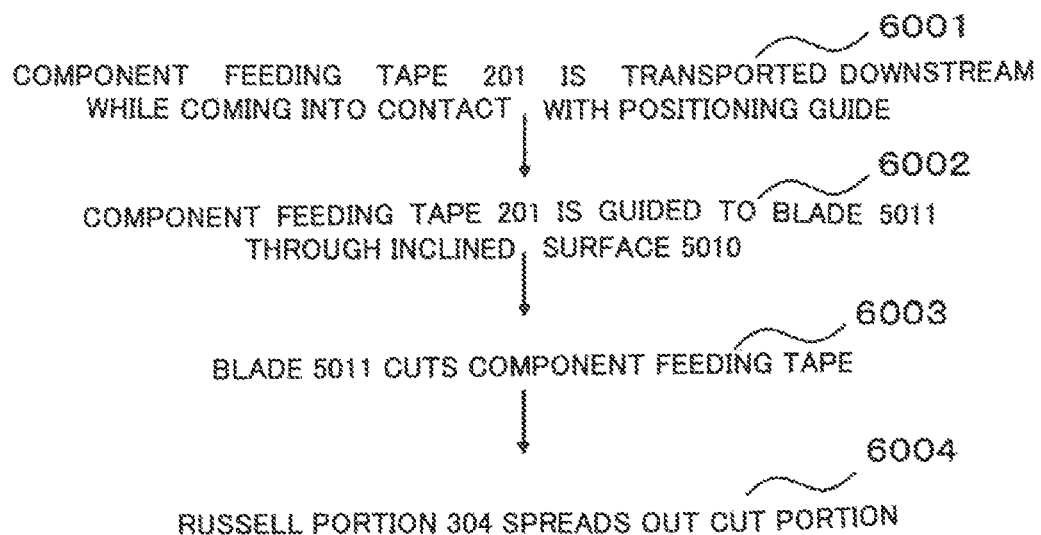
FIG. 6 is a flow illustrating that the electronic component exposing mechanism cuts a cover tape and exposes electronic components.

A flow through where the electronic component exposing mechanism 204 cuts the cover tape and exposes the components is now described with reference to FIG. 6. First, the component feeding tape 201 is transported in a downstream direction while bringing an upper direction thereof into contact with a lower direction of the positioning guide 302 at a step 6001. Then, the cover tape on the component feeding tape 201 is positioned with respect to the cutter 303 by the positioning guide 302, and thereafter guided to the blade 5011 through the inclined surface 5010 at a step 6002. Then, the blade 5011 cuts the cover tape at a step 6003. In other words, the forward end of the blade 5011 enters a space between the carrier tape on the lower side of the component feeding tape 201 transported through rotation of the sprocket 251 and the cover tape. The cover tape is raised and cut with the blade 5011 following further movement of the component feeding tape 201 in the downstream direction. Then, the cut cover tape is spread out with the Russell portion 304 structured in continuation with the cutter 304 at a step 6004. At this time, both sides of the cover tape are in states fused to the component feeding tape 201 (i.e., the carrier tape storing the components). The cutting and the spreading of the cover tape at the step 6003 and the step 6004 have been performed by a reaction force of a transportation force for the cover tape. The exposed electronic components are adsorbed and held by the component adsorbing/mounting device 109 from the component extraction hole 305.

Figure 7:
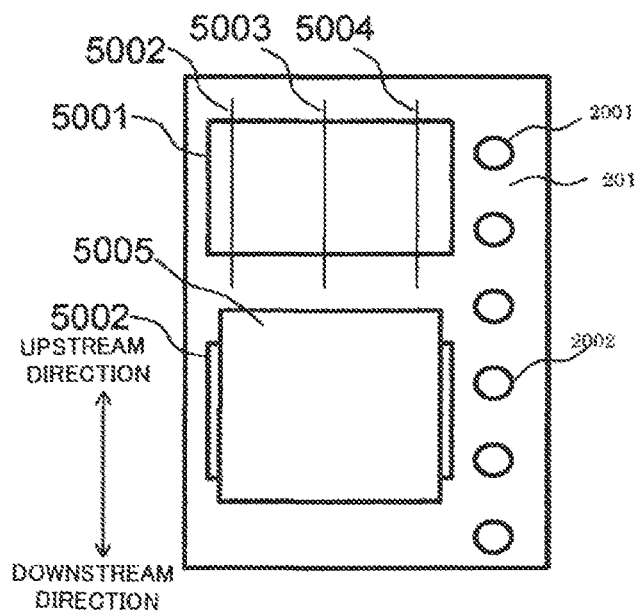
FIG. 7 is a diagram illustrating the relation between the electronic component exposing mechanism and the cover tape.

The cutter 303 may cut the cover tape on a substantially central upper portion of a pocket 5001 in FIG. 7 as shown by a line 5003. The cutter 303 may also cut the cover tape as shown by a line 5001 on the left side of the line 5003, or may also cut the cover tape as shown by a line 5004 on the right side of the line 5003. Further, the electronic component exposing mechanism 204 can also include a system of stripping/removing a cover tape 5005 in a prescribed region on a pocket 5002 in FIG. 7. The operator may arbitrarily decide how to remove the cover tape for extracting the electronic components.

Figure 8:
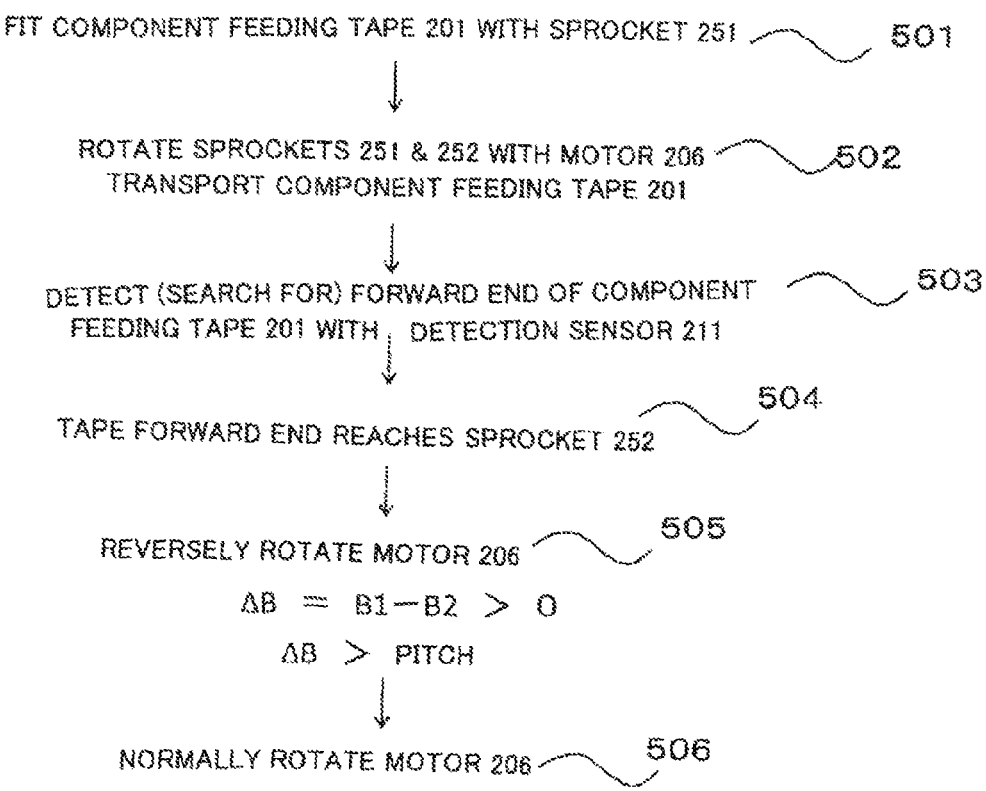
FIG. 8 is a flow transporting the component feeding tape 201 in Embodiment 1.

A flow of transporting the component feeding tape 201 in this Embodiment is now described with reference to FIG. 8. At a step 501, the component feeding tape 201 is set by the operator to fit the feed hole with the sprocket 251.

Then, the motor 206 so rotates at a step 502 that the sprocket 251 and the sprocket 252 rotate substantially at the same speed through the link mechanism 205. The component feeding tape 201 is transported by the sprocket 251 along the transportation path 209 from the upstream side toward the downstream side.

In the process of being transported from the upstream side toward the downstream side, further, the forward end position of the component feeding tape 201 is detected by the detection sensor 211 at a step 503.

At a step 504, the processing substrate 202 adjusts the rotation angle of the motor 206 by receiving the detection result of the detection sensor 211. Consequently, the component feeding tape 201 is so transported that the forward end thereof reaches the sprocket 252.

In succession, the motor 206 is reversely rotated at a step 505, and the motor 206 is normally rotated finally at a step 506 so that the component feeding tape 201 is transported from the upstream side in the downstream direction. Normal rotation denotes an operation of rotating the motor 206 so that the component feeding tape 201 is transported from the upstream side toward the downstream side, while reverse rotation denotes an operation of rotating the motor 206 so that the component feeding tape 201 is transported from the downstream side toward the upstream side.

At the step 505, the quantity of reverse rotation of the motor 206 is substantially not more than a backlash quantity B1 of the sprocket 251. The sprocket 251 does not rotate since the quantity of reverse rotation of the motor 206 is substantially not more than B 1. Assuming that the backlash quantity of the sprocket 252 is B2, on the other hand, B1>B2 and hence it follows that the sprocket 252 rotates in a direction for transporting the component feeding tape 201 in the upstream direction by the difference ΔB between B1 and B2. In other words, it can be expressed that the motor 206 does not rotate the sprocket 251, but rotates the sprocket 252 in the direction where the component tape 201 is transported from the downstream side toward the upstream side. The quantity of reverse rotation of the motor 206 may become substantially larger than the backlash quantity B1 of the sprocket 251.

At the step 504, such a state is attained that the forward end portion of the component feeding tape 201 goes past beyond the sprocket 252 toward the downstream side to some extent, so that the forward end of the component feeding tape 201 does no separate from the sprocket 252 at the time of the step 505. This state can be expressed as a state where at least part of at least one or more feed holes is present on the side downstream beyond the sprocket 252.

The mechanism through which the sprocket 252 fits with the feed hole at the step 505 is now described. When carrying out the step 505 in a state where the component feeding tape 201 does not fit with the sprocket 252 at the step 504, teeth of the sprocket 252 move while bringing an opposite side of the tape pressurizer 203 through the component feeding tape 201 into contact with the component feeding tape 201. At this time, the sprocket 251 does not rotate while the motor 206 rotates by the backlash quantity B1 and hence the tape 201 does not rotate due to driving of the sprocket 251. While the distance at which the teeth of the sprocket 252 move at the time of reverse rotation of the motor 206 becomes ΔB, ΔB is larger than the pitch and hence the teeth of the sprocket 252 reliably fit with the nearest feed hole on the downstream side regardless of the accumulated pitch error.

Even if ΔB is smaller than the pitch, it is possible that the teeth of the sprocket 252 having not fitted with the feed hole fit with the feed hole while the sprocket 252 rotates by ΔB. In particular, the teeth of the sprocket 252 easily fit with the feed hole when rendering ΔB larger than the accumulated pitch error of the transported tape 201.

When the sprocket 252 fits, the sprocket 251 enters a state not receiving power from the link mechanism 250 since the same is within the range of the backlash quantity B1, and does not apply useless force to the component feeding tape 201. Consequently, when the motor 206 normally rotates again at the step 506, the component feeding tape 201 is precisely positioned with reference to the sprocket 252 in the vicinity of the component extraction hole 305.

While the component feeding tape 201 may also fit with the sprocket 252 at the step 504 depending on the accumulated pitch error, teeth of the sprocket 252 and the sprocket 251 keep fitting states even if the teeth of the sprocket 252 so rotate as to transport the component feeding tape 201 toward the upstream side by ΔB at the time of reverse rotation of the motor 206, and hence no problem is caused in the transportation of the component feeding tape 201 also when the motor 206 thereafter normally rotates again at the step 506.

Non-fitting of the teeth of the sprockets can be suppressed by carrying out Embodiment 1 as described above, whatever the accumulated pitch error of the component feeding tape 201 may be. Consequently, the component feeding tape can be correctly transported.

Embodiment 2

Figure 9:
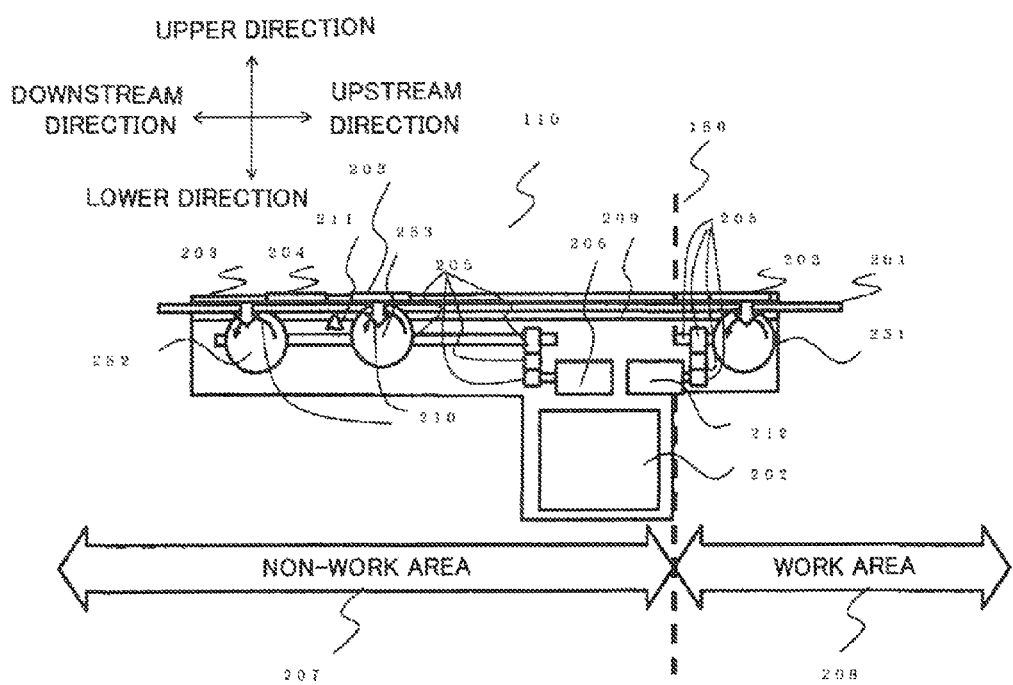
FIG. 9 is a diagram illustrating a component feeding device 110 in Embodiment 2.

Embodiment 2 is now described. In the following, portions different from Embodiment 1 are mainly described. FIG. 9 is a diagram illustrating a component feeding device according to this Embodiment.

A main difference from the component feeding device according to Embodiment 1 resides in a point that a sprocket 253 which is an example of a rotator and a motor 212 are added. According to this Embodiment, further, a sprocket 251 rotates with a motor 212 through a link mechanism 205, while the sprocket 253 and a sprocket 252 rotate with a motor 206 through the link mechanism 205. The tooth depth of the sprocket 251 is small as compared with the tooth depth(s) of at least one (desirably both) of the sprocket 252 and the sprocket 253, and the sprocket 251 includes a one-way clutch to be followingly rotatable when transportation force is applied to a component feeding tape 201 by the sprockets 252 and 253. The sprocket 251 may be a roller substantially having no teeth.

The large-small relation between a backlash quantity B3 of the sprocket 253 with the link mechanism 205 and a backlash quantity B2 of the sprocket 252 is B3>B2, and it is assumed that the difference ΔB between the backlashes is larger than a pitch (about 1 to 4 mm).

Figure 10:
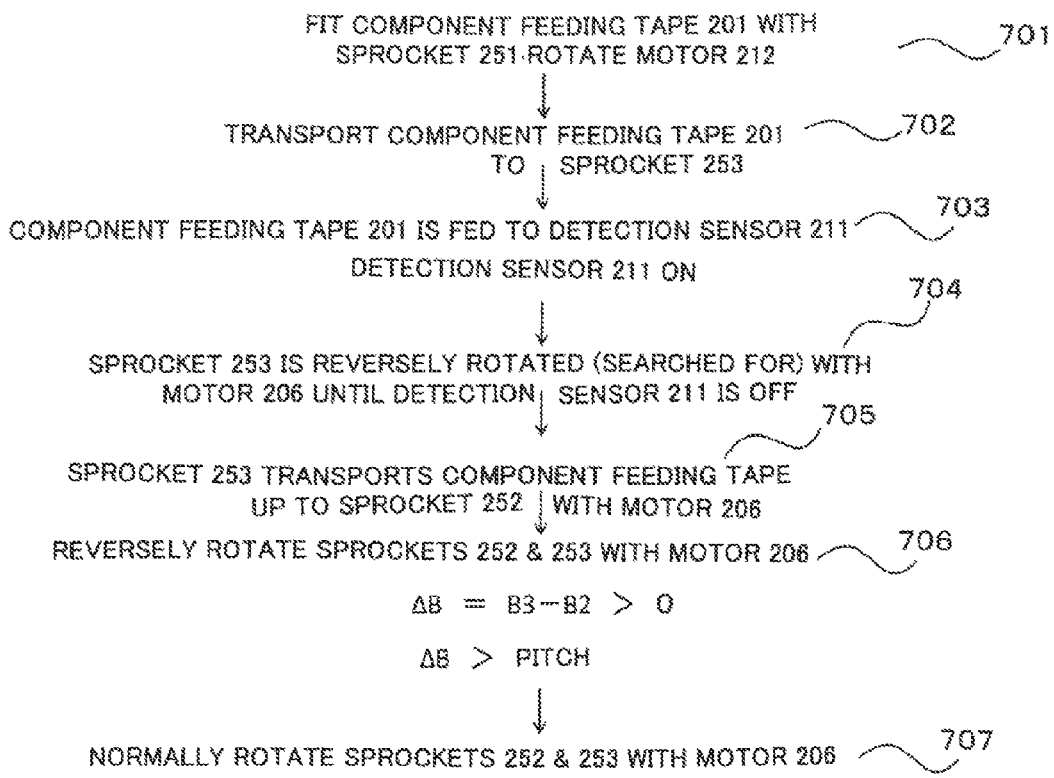
FIG. 10 is a flowchart transporting the component feeding device 110 in Embodiment 2.

A flow of transporting the component feeding tape 201 in this Embodiment is now described with reference to FIG. 10.

At a step 701, the component feeding tape 201 is first set by an operator to fit a feed hole with the sprocket 251.

Then, the motor 212 so rotates that the sprocket 251 rotates at 702, and the component feeding tape 201 is transported along a transportation path 209. Then, the sprocket 253 fits with the feed hole of the component feeding tape 201. The motor 212 and the motor 206 adjust rotation of the sprocket 251 and the sprocket 253 thereby performing fitting of the sprocket 253. Fitting of the sprocket 253 can be performed with no problem by setting the rotational speeds of the sprockets so that the rotational speed of the sprocket 253>the rotational speed of the sprocket 251, for example.

Further, a detection sensor 211 detects the forward end of the component feeding tape 201 at a step 703.

At a step 704, a processing substrate 202 receives a detection result of the detection sensor 211 and reversely rotates the sprocket 253 with the motor 206. This reverse rotation is performed until the detection sensor 211 cannot detect the component feeding tape 201. It takes time to transport the component feeding tape 201 while precisely controlling rotation angles of the sprockets 251 and 253. However, the transportation time for the component feeding tape can be reduced for improving production efficiency by transporting the component feeding tape 201 without controlling the rotation angles of the sprockets 251 and 253 in the flow from the step 701 up to the step 703 and performing transportation of the component feeding tape 201 by precisely controlling the rotation angles of the sprockets 251 and 253 with the detection sensor 211 after the step 704 as in this Embodiment. This Embodiment does not exclude an operation of controlling the rotation angles of the sprockets 251 and 253 in the flow from the step 701 up to the step 703.

At a subsequent step 705, the processing substrate 202 receives a detection result of the detection sensor 211 and transports the component feeding tape 201 so that the forward end of the component feeding tape 201 reaches the sprocket 252 by adjusting the rotation angle of the motor 206.

Subsequently at a step 706, the processing substrate 202 reversely rotates the motor 206.

Finally, the processing substrate 202 normally rotates the motor 206, and the component feeding tape 201 is transported in a downstream direction, as shown at a step 707.

While the motor 212 is in a stopped state after the step 702, the tooth depth of the sprocket 251 is so small that the fitting between the sprocket 251 and the component feeding tape 201 comes off when the component feeding tape 201 is transported in an upstream direction at the step 704 or the step 706, not to inhibit the component feeding tape 201 from being transported in the upstream direction.

At the steps 703, 705 and 707, the sprocket 251 rotates followingly to the component feeding tape 201 due to the one-way clutch, not to inhibit this. The transportation of the component feeding tape 201 is performed by the sprocket 252 and the sprocket 253 after the step 702, and hence the sprocket 251 may simply not inhibit these, and the fitting state of the sprocket 251 may be in either state of being maintained or canceled.

The quantity of reverse rotation of the motor 206 is B3 at the step 706, and the sprocket 253 does not rotate since the same does not exceed B3 when performing reverse rotation. On the other hand, B3>B2 and hence it follows that the sprocket 252 rotates in a direction for transporting the component feeding tape in the upstream direction by the difference ΔB between B3 and B2.

At the step 705, the forward end portion of the component feeding tape 201 is brought into a state going past beyond the sprocket 252 in the downstream direction to some extent so that the forward end of the component feeding tape 201 does not separate from the sprocket 252 when transporting the component feeding tape 201 in the upstream direction by ΔB at the step 706. As to the mechanism of fitting through the step 706, description is omitted for avoiding repetition.

As hereinabove described, Embodiment 2 can also suppress non-fitting of teeth of the sprockets whatever the accumulated pitch error of the component feeding tape 201 may be.

While Embodiments of the present disclosure have been described, the present disclosure is not restricted to Embodiments. The structure of the component mounting device may be a structure other than that of FIG. 1. While the example that two sprockets are driven by the link mechanism substantially with the same motor to rotate substantially at the same speeds has been described in each of Embodiments 1 and 2, application is possible also to a larger number of sprockets. In this case, non-fitting can be suppressed by setting the quantities of backlashes of adjacent sprockets to be the upstream side>the downstream side and repeating an operation of reversely rotating the motor every time the tape forward end portion reaches the sprocket on the downstream side.

Further, while the difference between the backlashes described in Embodiments 1 and 2 can be implemented by a method of differentiating dislocation states of gears of the link mechanism driving the sprockets or the like, for example, the present disclosure is not restricted thereto.

The detection of the forward end of the component feeding tape and the control method for the arrival state at the sprocket on the downstream side in Embodiments 1 and 2 have been shown as examples and various methods such as that of changing the position of the detection sensor 211 or the like are considerable, and hence the present disclosure is not restricted to the aforementioned means.

In a case where the accumulated pitch error is suppressed to a range of some extent due to a standard or the like, the difference ΔB between the sprockets driven with the same motor may not be rendered larger than the design value P (about 1 to 4 mm) of the distance between the two adjacent feed holes.

The invention claimed is:

1. A component feeding device comprising:
a first drive sprocket for transporting a component feeding tape; and
a second drive sprocket arranged on a downstream side beyond the first drive sprocket, wherein
a first backlash that is a clearance of meshing with a power transmission portion of the first drive sprocket is larger than a second backlash that is a clearance of meshing with a power transmission portion of the second drive sprocket.

2. The component feeding device according to claim 1, further comprising a first driving portion for rotating the first drive sprocket and the second drive sprocket, wherein
the first driving portion reversely rotates the first drive sprocket and the second drive sprocket.

3. The component feeding device according to claim 2, further comprising a link mechanism connecting the first drive sprocket, the second drive sprocket and the first driving portion with each other.

4. The component feeding device according to claim 3, further comprising a sensor for detecting a forward end of the component feeding tape between the first drive sprocket and the second drive sprocket.

5. The component feeding device according to claim 4, further comprising a component exposing device for exposing a component from the component feeding tape between the first drive sprocket and the second drive sprocket.

6. The component feeding device according to claim 5, further comprising a rotator on an upstream side beyond the first drive sprocket.

7. The component feeding device according to claim 6, further comprising a second driving portion for rotating the rotator.

8. The component feeding device according to claim 7, wherein
the rotator includes a one-way clutch.

9. The component feeding device according to claim 8, wherein
a difference between the first backlash and the second backlash is larger than a pitch of a feed hole of the component feeding tape.

10. The component feeding device according to claim 1, further comprising a first driving portion for rotating the first drive sprocket and the second drive sprocket, and having a link mechanism connecting the first drive sprocket, the second drive sprocket and the first driving portion with each other.

11. The component feeding device according to claim 1, further comprising a sensor for detecting the forward end of the component feeding tape between the first drive sprocket and the second drive sprocket.

12. The component feeding device according to claim 1, further comprising a component exposing device for exposing a component from the component feeding tape between the first drive sprocket and the second drive sprocket.

13. The component feeding device according to claim 1, further comprising a rotator on an upstream side beyond the first drive sprocket.

14. The component feeding device according to claim 13, further comprising a second driving portion for rotating the rotator.

15. The component feeding device according to claim 14, wherein
the rotator includes a one-way clutch.

16. The component feeding device according to claim 1, wherein
a difference between the first backlash and the second backlash is larger than a pitch of a feed hole of the component feeding tape.

17. A component mounting device comprising:
a component feeding device; and
a component adsorbing/mounting device that mounts a component adsorbed at the component feeding device on a substrate, and
the component feeding device having
a first drive sprocket for transporting a component feeding tape; and
a second drive sprocket arranged on a downstream side beyond the first drive sprocket, wherein
a first backlash that is a clearance of meshing with a power transmission portion of the first drive sprocket is larger than a second backlash that is a clearance of meshing with a power transmission portion of the second drive sprocket.

18. The component mounting device according to claim 17, further comprising a first driving portion for rotating the first drive sprocket and the second drive sprocket, wherein
the first driving portion reversely rotates the first drive sprocket and the second drive sprocket.

19. The component mounting device according to claim 18, further comprising a link mechanism connecting the first drive sprocket, the second drive sprocket and the first driving portion with each other.

20. The component mounting device according to claim 19, further comprising a sensor for detecting a forward end of the component feeding tape between the first drive sprocket and the second drive sprocket.

21. The component mounting device according to claim 20, further comprising a component exposing device for exposing a component from the component feeding tape between the first drive sprocket and the second drive sprocket.

22. The component mounting device according to claim 21,
further comprising a rotator on an upstream side beyond the first drive sprocket.

23. The component mounting device according to claim 22,
further comprising a second driving portion for rotating the rotator.

24. The component mounting device according to claim 23, wherein
the rotator includes a one-way clutch.

25. The component mounting device according to claim 24, wherein
a difference between the first backlash and the second backlash is larger than a pitch of a feed hole of the component feeding tape.

26. The component mounting device according to claim 17,
further comprising a first driving portion for rotating the first drive sprocket and the second drive sprocket, and having a link mechanism connecting the first drive sprocket, the second drive sprocket and the first driving portion with each other.

27. The component mounting device according to claim 17,
further comprising a sensor for detecting the forward end of the component feeding tape between the first drive sprocket and the second drive sprocket.

28. The component mounting device according to claim 17,
further comprising a component exposing device for exposing a component from the component feeding tape between the first drive sprocket and the second drive sprocket.

29. The component mounting device according to claim 17,
further comprising a rotator on an upstream side beyond the first drive sprocket.

30. The component mounting device according to claim 29,
further comprising a second driving portion for rotating the rotator.

31. The component mounting device according to claim 30, wherein
the rotator includes a one-way clutch.

32. The component mounting device according to claim 17, wherein
a difference between the first backlash and the second backlash is larger than a pitch of a feed hole of the component feeding tape.

* * * * *